United States Patent
Elad et al.

(10) Patent No.: US 8,476,945 B2
(45) Date of Patent: Jul. 2, 2013

(54) PHASE PROFILE GENERATOR

(75) Inventors: Danny Elad, Moshav Liman (IS); Daniel J. Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 13/069,653

(22) Filed: Mar. 23, 2011

(65) Prior Publication Data

US 2012/0242383 A1 Sep. 27, 2012

(51) Int. Cl.
*H03L 7/06* (2006.01)

(52) U.S. Cl.
USPC .......................... 327/156; 327/159; 327/231

(58) Field of Classification Search
USPC .............. 327/155–156, 159; 331/17, 25, 1 A
See application file for complete search history.

(56) References Cited

U.S. PATENT DOCUMENTS

| | | | |
|---|---|---|---|
| 4,075,577 A | 2/1978 | Walker | |
| 4,184,158 A | 1/1980 | Smith, 2nd | |
| 4,480,232 A | 10/1984 | Baker et al. | |
| 4,780,770 A | 10/1988 | Wagner | |
| 5,258,724 A | 11/1993 | Tanis et al. | |
| 5,396,492 A | 3/1995 | Lien | |
| 5,414,741 A | 5/1995 | Johnson | |
| 5,446,760 A | 8/1995 | Bienz et al. | |
| 5,825,257 A | 10/1998 | Klymyshyn et al. | |
| 5,834,985 A | 11/1998 | Sundegard | |
| 8,000,428 B2 * | 8/2011 | Staszewski et al. ........... | 375/362 |
| 8,031,007 B2 * | 10/2011 | Chang et al. ................. | 331/1 A |
| 2006/0267640 A1 | 11/2006 | Travis | |
| 2008/0089401 A1 | 4/2008 | Lai et al. | |
| 2008/0192877 A1 | 8/2008 | Eliezer et al. | |
| 2008/0315959 A1 * | 12/2008 | Zhuang et al. ................. | 331/17 |

OTHER PUBLICATIONS

Chen, P.L., et al. "A Standard Cell-Based Frequency Synthesizer With Dynamic Frequency Counting" IEICE Transactions on Fundamentals of Electronics, Communications and Computer Sciences, vol. E88-A, Issue: 12. Dec. 2005. pp. 3554-3563.

Musch, T. "A High Precision 24-GHZ FMCW Radar Based on a Fractional-N Ramp-PLL" IEEE Transactions on Instrumentation and Measurement, vol. 52, No. 2. Apr. 2003. pp. 324-327.

Wagner, C., et al. "Adaptive Frequency Sweep Linearization Based on Phase Accumulator Principle" IEEE International Microwave Symposium 2007. Jun. 2007. pp. 1319-1322.

Wagner, C., et al. "A 77-GHZ FMCW Radar Using a Digital Phase-Locked Synthesizer" IEEE International Microwave Symposium 2008. Jun. 2008. pp. 351-354.

* cited by examiner

*Primary Examiner* — An Luu
(74) *Attorney, Agent, or Firm* — Tutunjian & Bitetto, P.C.; Anne Dougherty

(57) ABSTRACT

Phase profile generator systems and methods are disclosed. A system includes a signal generator, a target phase trajectory module, an error detector and a control loop filter. The signal generator is configured to generate an output signal. In addition, the target phase trajectory module is configured to track a target phase trajectory and determine a next adjustment of the output signal to conform the output signal to a portion of the target phase trajectory. Further, the error detector is configured to determine an error between the output signal and a current target phase trajectory value that precedes the portion of the target phase trajectory, where the determination of the error is independent of the next adjustment of the output signal. Moreover, the control loop filter is configured to control the signal generator in accordance with both the next adjustment and the error to generate a phase profile.

25 Claims, 4 Drawing Sheets

PHASE PROFILE GENERATOR

BACKGROUND

1. Technical Field

The present invention relates to phase control of a signal and, more particularly, to methods, devices and apparatuses for conforming a signal to a target phase trajectory.

2. Description of the Related Art

Precise frequency ramping is often an important aspect of frequency synthesis and clocking applications. One specific example of such applications is a frequency modulated continuous-wave (FMCW) radar system, which uses linear frequency ramps for clock synthesis. Precision is also important in dynamic frequency scaling (DFS) applications for controlling microprocessor or application-specific integrated circuit (ASIC) clock signals.

To implement frequency ramping, both open-loop and closed loop systems can be used. For example, frequency ramping can be achieved in an open loop system by sweeping a voltage controlled oscillator (VCO) control voltage to generate an output frequency profile. Off-line calibration can be employed to support this system. Frequency ramping in open loop systems can alternatively be implemented by applying filters that modulate the natural dynamics of a phase-locked loop (PLL). In closed loop systems, an analog PLL can be used to track an input reference with a time-varying frequency. Alternatively, closed-loop systems can institute frequency ramping by adjusting a feedback divider value in a fractional-N synthesizer. Precise frequency ramping can be achieved in a variety of ways with varying degrees of success.

SUMMARY

One embodiment is directed to a phase profile generator system. The system includes a signal generator, a target phase trajectory module, an error detector and a control loop filter. The signal generator is configured to generate an output signal. In addition, the target phase trajectory module is configured to track a target phase trajectory and determine a next adjustment of the output signal to conform the output signal to a portion of the target phase trajectory. Further, the error detector is configured to determine an error between the output signal and a current target phase trajectory value that precedes the portion of the target phase trajectory, where the determination of the error is independent of the next adjustment of the output signal. Moreover, the control loop filter is configured to control the signal generator in accordance with both the next adjustment and the error to generate a phase profile.

Another embodiment is also directed to a phase profile generator system. The system includes a signal generator, a monitoring unit, a target phase trajectory module and a control loop filter. The signal generator is configured to generate an output signal and the monitoring unit is configured to monitor a current state of the output signal. Additionally, the target phase trajectory module is configured to track a target phase trajectory and determine an adjustment of the output signal independently of the monitored current state to conform the output signal to the target phase trajectory. Further, the control loop filter is configured to directly receive the adjustment and to control the signal generator in accordance with the adjustment and generate a phase profile.

An alternative embodiment is directed to a phase profile generator system. The system includes a signal generator, a target phase trajectory module, an error detector and a control loop filter. The signal generator is configured to generate an output signal. In addition, the target phase trajectory module is configured to track a target phase trajectory and determine a next adjustment of the output signal to conform the output signal to the target phase trajectory. Further, the error detector is configured to determine an error between the output signal and the target phase trajectory. Moreover, the control loop filter is configured to receive the error separately from the adjustment and to control the signal generator in accordance with both the adjustment and the error to generate a phase profile.

Another embodiment is directed to a method for generating a phase profile. In accordance with the method, a target phase trajectory is tracked to determine a next adjustment of an output signal of a signal generator to conform the output signal to a portion of the target phase trajectory. The method further includes determining an error between the output signal and a current target phase trajectory value that precedes the portion of the target phase trajectory, where the determination of the error is independent of the next adjustment of the output signal. In addition, the signal generator is controlled in accordance with both the next adjustment and the error to generate the phase profile.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
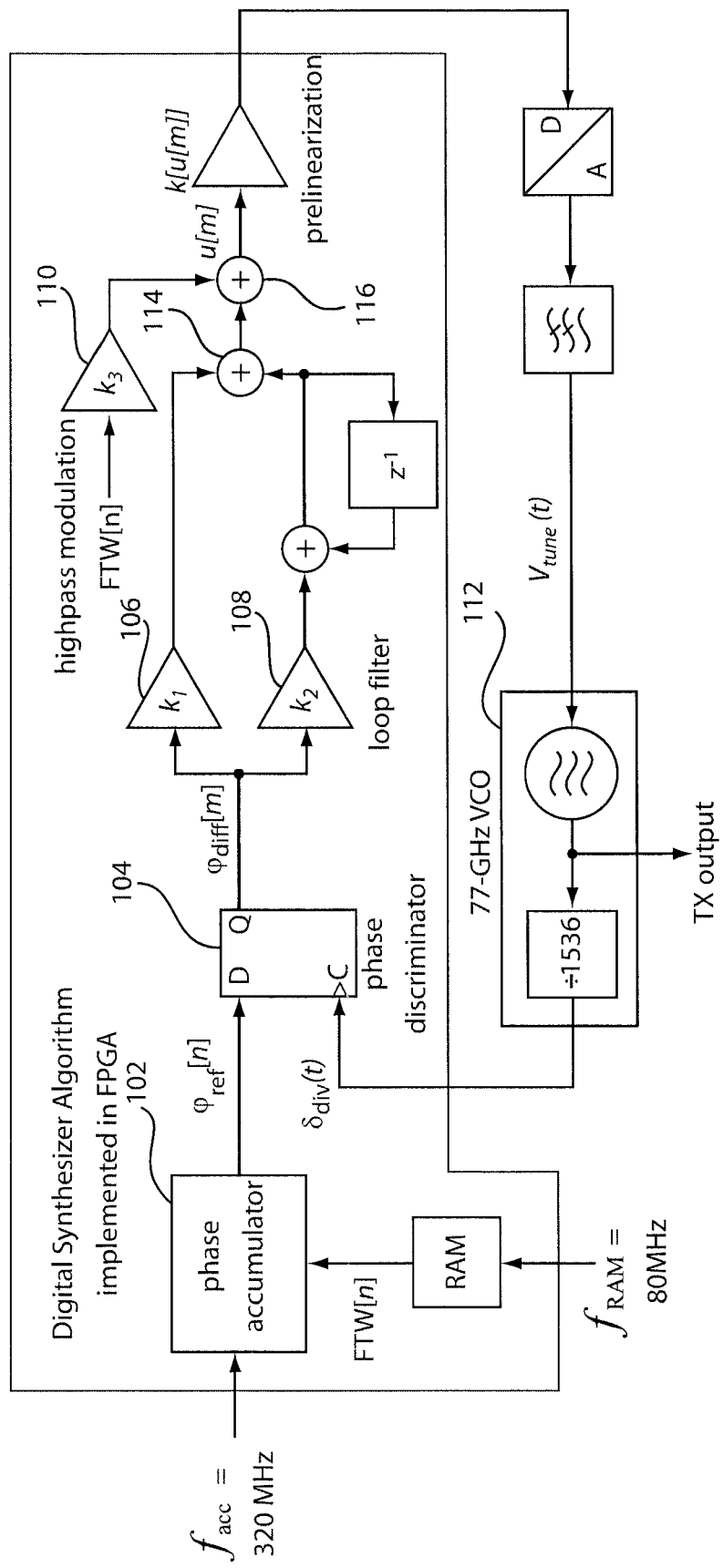
FIG. 1 is a diagram of a prior art frequency ramp generator.

The systems and methods described herein can be used in a wide array of applications. The systems and methods can be applied in many different classes of radars, including FMCW radar systems. In addition, the embodiments can be readily adapted to generate a linear and/or a non-linear phase profile, such as a frequency stair case or a quadratic ramp. The systems and methods can also be used in any secure wireless communication system in which frequency hopping or frequency slewing is involved.

In addition to having wide applicability, phase generator system and method embodiments described herein provide significant improvements in efficiency and in the reduction of noise. In particular, output signal adjustments, such as frequency ramps, that are configured to conform output signals to a target phase trajectory can be applied directly to a loop filter of a control loop. Thus, the phase error can be determined and/or applied to the loop filter independently of the adjustment, thereby ensuring that the magnitude of the error is relatively small. As a result, the bandwidth of the control loop and the control value in a proportional path can be decreased, thereby significantly reducing noise in the system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in flowchart and/or block diagram blocks.

The flowchart and block diagrams in the Figures illustrate the architecture, functionality, and operation of possible implementations of systems, methods and computer program products according to various embodiments of the present invention. In this regard, blocks in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer faun (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Prior to discussing embodiments of the present invention in more detail, it is important to note some of the deficiencies of certain known open loop and closed loop systems. For example, such open loop systems suffer from repeatability, linearity and noise sensitivity problems or do not feature broad controllability of system dynamic behavior. In addition, a main drawback of the fractional-N closed loop approach described above is the coarse quantization of the divider, which limits achievable performance. Further, the analog PLL tracking of a varying reference clock frequency discussed above utilizes a high bandwidth requirement for the PLL. This closed loop approach also presents challenges in generating a smoothly varying reference signal. Moreover, it is difficult to support arbitrary frequency profiles, such as sawtooth shapes, using this type of closed loop scheme.

Referring now to the drawings in which like numerals represent the same or similar elements and initially to FIG. 1, a known example 100 of a closed loop system with a mostly digital control loop is illustrated. The system 100 includes a phase accumulator 102, a phase discriminator 104 and a loop filter comprising a proportional path amplifier ($k_1$) 106 and an integral path amplifier ($k_2$) 108. The system 100 further includes a high pass modulation path amplifier ($k_3$) 110 and a VCO 112. The basic control loop of the system 100 is composed of the proportional path $k_1$ and the integral path $k_2$ and is essentially a regular PLL that is digitally implemented. As illustrated in FIG. 1, the proportional path $k_1$ and the integral path $k_2$ are added by the adder 114 in the digital domain to control the VCO 112 and thereby implement a digital frequency ramp. In addition, the resulting signal from the adder 114 is summed with the high pass modulation path $k_3$ in the digital domain by an adder 116. Unfortunately, the design of the system 100 poses several problems.

For example, the addition of the proportional $k_1$ and the integral $k_2$ paths of the loop filter in the digital domain as proposed in FIG. 1 is extremely detrimental to overall synthesizer performance, as the addition increases overall control loop latency. Moreover, implementing the addition of the highpass modulation path $k_3$ with the resultant signal in the digital domain further increases control loop latency, and essentially impairs the performance of the proposed system. It can be shown that the very high intrinsic latency of the system 100 results in significant noise that is added by the digital PLL. It should also be noted that the system 100 tends to have a very high bandwidth due to the tracking of the rapidly varying error signal from the phase discriminator 104. As described further herein below, embodiments of the present principles do not suffer from any of these performance limitations.

In particular, exemplary embodiments include digital PLL-based arbitrary phase profile generators that include improvements to overall loop performance and have a wider scope of possible applications. In accordance with one aspect, a desired clock behavior in the frequency domain can be achieved by controlling the output phase profile of the system. Furthermore, the output phase profile can be controlled to enable the generation of arbitrary frequency profiles.

Figure 2:
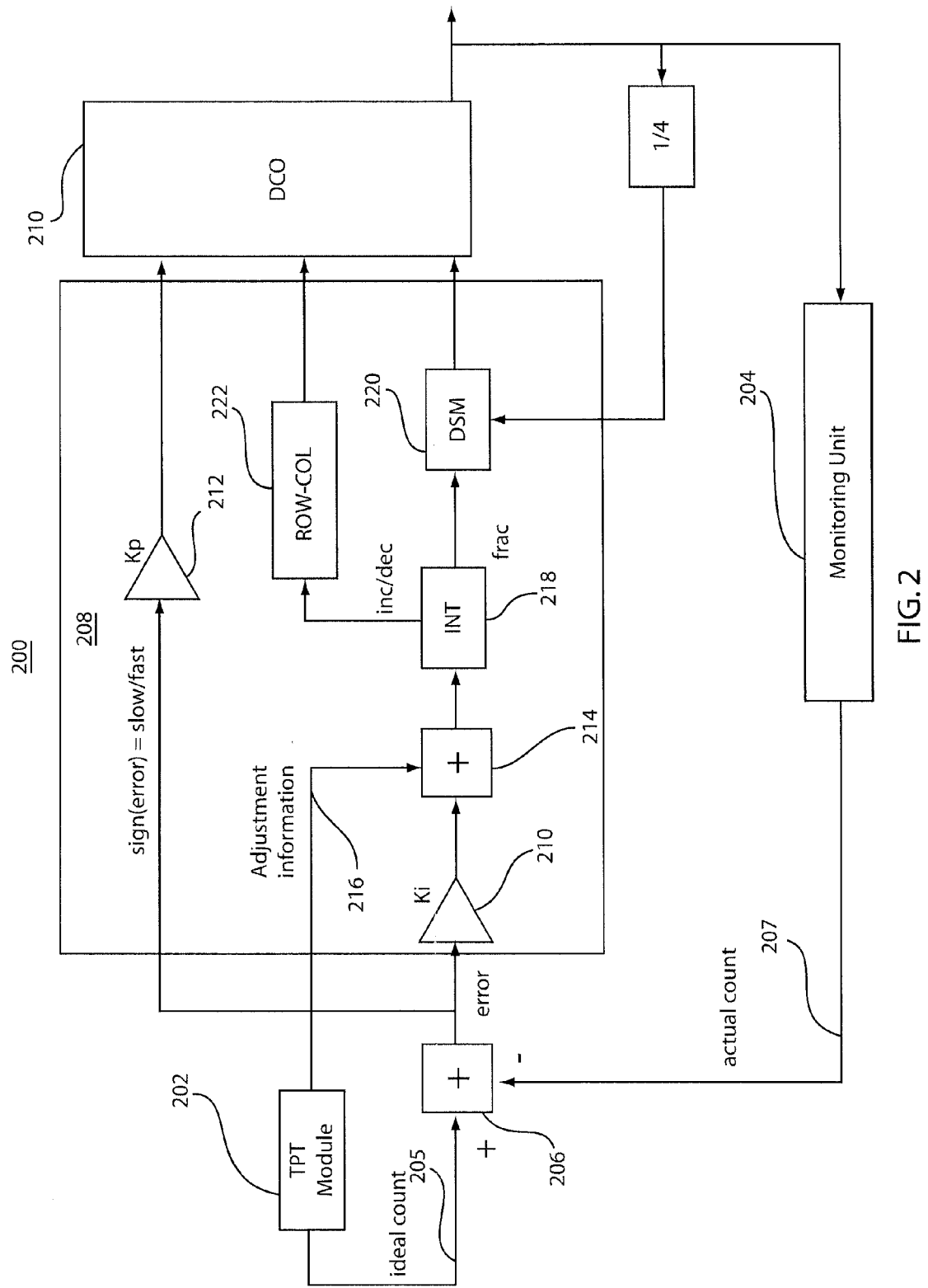
FIG. 2 is a block/flow diagram of a phase profile generator system, device and apparatus embodiment.

With reference now to FIG. 2, a system 200 in accordance with one exemplary embodiment of a phase profile generator is illustrated. The system 200 includes a digitally controlled oscillator (DCO) and an associated control system that generates target phase profiles to enable the creation of a broad range of frequency dynamics. Examples of frequency dynamics that can be implemented by the systems described herein include jumps between points with short settling times, linear frequency ramps, quadratic frequency ramps and any combination of the preceding dynamics, in addition to other dynamics.

The system 200 can include three components. Firstly, the system 200 can include a target phase trajectory (TPT) module 202 that digitally generates an ideal target phase trajectory and/or stores and reads back the ideal target phase trajectory. Secondly, the system 200 can include a means for measuring the actual output phase trajectory of the system 200. Here, the measuring means can be implemented by a monitoring unit 204. In the exemplary embodiment illustrated in FIG. 2, the monitoring unit 204 can comprise a 20-bit counter. Thirdly, the system 200 can include a control loop that acts to reduce the error between the ideal and output phase trajectory In the embodiment depicted in FIG. 2, the control loop can comprise an error detector 206, a loop filter 208 and a DCO 210. Although a DCO is used here, element 210 can be any signal generator in accordance with various embodiments. The TPT module 202 can provide an ideal count input 205, which defines the target phase trajectory behavior, to the error detector 206. The error detector 206 also receives the actual count 207 from the monitoring unit 204 and determines and outputs the difference between the actual count 207 and the ideal count 205. The actual count 207 is essentially a signal from the DCO that is sampled through the monitoring unit 204, which can be implemented as a ripple counter. Here, the difference represents the error between the desired and actual phase trajectory and can be output to the loop filter 208.

The loop filter 208 can include an integral path amplifier ($k_i$) 210, a proportional path amplifier ($k_p$) 212 and an integrator 218. As such, the error signal corresponding to the output of the error detector 206 is applied via a proportional-integral filter 208, with gain constants represented in the diagram by the $k_p$ and $k_i$ blocks, respectively. As depicted in FIG. 2, the proportional path $k_p$ can be directly input to the DCO 210. In turn, the integral path 210 can be input to an adder 214, which adds the integral path with adjustment information 216 provided by the TPT module 202. For example, if the system 200 is implemented as an all-digital counter-based linear frequency ramp generator and the desired phase trajectory defines a frequency ramp, then the adjustment information 216 can be the ramp slope. The output of the adder 214 can be provided to the integrator 218, which is in signal communication with a DCO controller 222 and a delta-sigma modulator (DSM) 220. The DCO controller 222 can apply 320 integer controls to the DCO based on the input provided by the integrator 218.

It should be noted that the TPT module 202 can select the adjustment information 216 as one control of a default set of controls. In their simplest form, these controls provide open-loop control information to help reduce the work that is done by the control loop itself. It should be further noted that the input 216 need not be constant, but can be adaptively updated by the TPT module 202. Furthermore, the input 216 can be dependent on state variables in the system 200, enabling the input to help compensate for non-idealities, such as DCO non-linearity.

It is also important to note several fundamental differences between the embodiment of system 200 depicted in FIG. 2 and the system of FIG. 1. For example, as noted above, the basic control loop comprising the proportional path $k_1$ and the integral path $k_2$ shown in FIG. 1 is a regular PLL that is just digitally implemented. This PLL still needs to have a high bandwidth in order to be able to follow the frequency ramps generated by the phase discriminator in the same manner in which a regular analog PLL has to follow the ramps of a reference signal. In contrast, in the embodiment illustrated in FIG. 2, a pre-calculated deterministic phase trajectory, such as a linear frequency ramp, or any other type of trajectory, is inserted directly into the loop filter 208 as input 216. The insertion of the phase trajectory can be done independently of the phase detector output. Also, the phase trajectory determination and insertion can be implemented in a predictive and adaptive manner. As a result, in accordance with the system 200, a phase error detector, such as the error detector 206, may only compare the difference between the ideal trajectory and the actual output of the synthesizer; the phase error detector need not consider or compensate for the ramp in any way. Here, the resulting phase error is much smaller than the phase error measured in the system 100. The difference in phase error magnitudes illustrates the difference between predictive control provided by the system 200 and reactive control provided by the system 100. Because the value of the error signal is significantly reduced, as compared to non-predictive implementations, such as system 100, the $k_p$ control can have a smaller value (i.e. smaller digital PLL bandwidth), resulting in a reduction of phase noise.

Moreover, unlike the simple digital to analogue converter (DAC)-VCO in FIG. 1, the DCO 210 has a separate, low latency direct control input for the proportional path $k_p$. The direct coupling between the proportional path $k_p$ with the DCO 210 resolves the latency issue due to the digital addition of the $k_1$ and $k_2$ paths in system 100 described above. Similarly, in accordance with system 200, any other high-pass controls, such as $k_3$ in system 100, can also be applied directly to the DCO with zero added latency.

In accordance with other exemplary aspects of the present principles, a number of enhancements can be implemented in the monitoring unit 204. As stated above, the monitoring unit 204 can be implemented as a 20-bit feedback counter. The 20-bit number is just an example parameter and need not be fixed in the system 200. The 20-bit readout signal from the monitoring unit 204 represents a running count of all (full rate) output DCO cycles that have occurred between the corresponding reference edges. The resolution of the unit 204 is important to the system performance and can be significantly improved in several ways. First, the unit 204 need not be reset to a fixed state (zero) after every reference clock cycle. Retaining the internal state of all registers in the counter will increase its effective resolution by preserving the quantization error from one readout to the next readout. Second, the unit 204 can interpolate between count values based on DCO control inputs, providing a sub-unit cycle resolution. Thirdly, the monitoring unit 204 can employ various time-to-digital conversion (TDC) approaches to even further improve resolution. The monitoring unit 204 can use a plurality of counters running from different phases of a multi-phase DCO. This combination of counters would offer (sub-unit cycle) phase information that is more precise than a single counter running from a single phase.

Another aspect of the system 200 is that the ideal target phase trajectory can be generated with arbitrary precision. For example, the ideal target phase trajectory need not be limited by the capabilities of the feedback monitoring system 204. For example, the monitoring unit 204 can be implemented as a 20-bit counter and the feedback signal can be the state of the 20-bit counter, where the signal represents an integer number of DCO output cycles between reference clock edges. Here, the ideal trajectory can have a higher resolution by using non-integer numbers. In one implementation, the ideal count 205 can be composed of 32 bits, the feedback signal output by the monitoring unit 204 can be composed of 20 bits and the error signal output by the detector 206 can be composed of 32 bits. Specifically, instead of advancing the ideal counter by 5 for each reference clock cycle, the TPT module 202 can advance the counter by, for example, 5.01. The use of non-integer counts in this manner will reduce the quantization noise in the system, providing a clear benefit in loop performance.

To better illustrate how the system 200 can be implemented, the operation of one specific embodiment is described herein below. However, it should be understood that the present invention is in not limited to the particular details provided herein below for the embodiment. All blocks in the embodiment, except the DCO 210 and DSM 220, run at 200 MHz, as clocked by a reference clock. It is assumed that this embodiment is implemented as a frequency ramp generator and that the adjustment information 216 is a ramp slope. Here, the DCO 210 ramps from 8 GHz to 9 GHz in 100 µs and the DSM 220 runs at ¼ of the DCO 210 clock. At the start of the ramp, all internal states are reset to zero. In this state, the DCO 210 is assumed to run at 8 GHz exactly. At the end of the ramp, when all 320 integer DCO controls are applied, the DCO is assumed to run at 9 GHz exactly. The initial and final frequencies can be achieved with high precision in actual hardware with a regular PLL loop (not shown) locking to 8 or 9 GHz from a very good initial state, which should be stored. Accordingly, the 320 control inputs, in addition to its fractional part that is applied through the DSM 220, will be process, voltage and temperature (PVT) sensitive. The TPT module 202 can be configured to keep track of the number of control inputs in order to pre-compute the ramp slope, which is a 24-bit number that is applied to the integrator 218 when the error measured by the detector 206 is zero. By employing additional memory, the TPT module 202 can dynamically adjust the ramp slope based on controls from previous ramps, such as pre-distortion control, etc. Here, the TPT module 202 can model DCO non-linearity as a quadratic deviation from an ideal linear transfer function, where the maximum frequency delta in the free-running DCO is achieved in the middle of the ramp. In addition, the error signal output by the detector 206 can be employed for bang-bang proportional "$k_p$" control of the DCO in the proportional control path. The error may also be utilized in a linear fashion by multiplying it by $k_i$ and adding it to the ramp slope and thereby control the DCO 210.

Further, the monitoring unit 204 is implemented as a 20-bit ripple counter, which asynchronously counts the DCO 210 outputs. The "actual count" number is the state of the counter, sampled by the reference clock. This 20-bit binary number goes from 0 to 850,000 in one ramp. The actual count number 207 is compared on every reference clock cycle to the ideal count 20-bit number 205. The ideal count 205 can be calculated on-chip with another simple integrator or can be pre-computed. The result of the comparison here is the "error" signal.

It should be noted that retaining the full state of the ripple counter, as opposed to resetting the counter on every clock cycle, permits phase integration for the entire ramp duration. The phase integration has at least two important benefits. First, the phase error precision grows in time as the ramp progresses. For example, if the control loop manages to keep the error signal within +1/−1, the system can achieve an accuracy of about 1 out 850,000 by the end of the ramp. Second, the quantization noise associated with counting integer DCO cycles is first-order DSM-shaped to high frequencies. For example, the fractional phase error from one sample can be subtracted from the next, resulting in a $1-z^{-1}$ transfer function. Thus, the ripple counter can be viewed as an integrator.

In alternative implementations of the system, the phase profile generator can adapt the adjustment information 216 based on the history of DCO controls. For example, in the simplest case, the adjustment information 216, such as a ramp slope, applied to the filter can be just a constant number that is added to the integral path to guarantee frequency skewing. This control input can also be used to pre-distort the DCO control so that the resulting output frequency of the DCO is linear using non-linear digital controls at the filter and DCO input. In many applications, such as FMCW and others, the same ramp is generated multiple times. The control system can then be trained to provide a better output based on the history of the previous runs.

Figure 3:
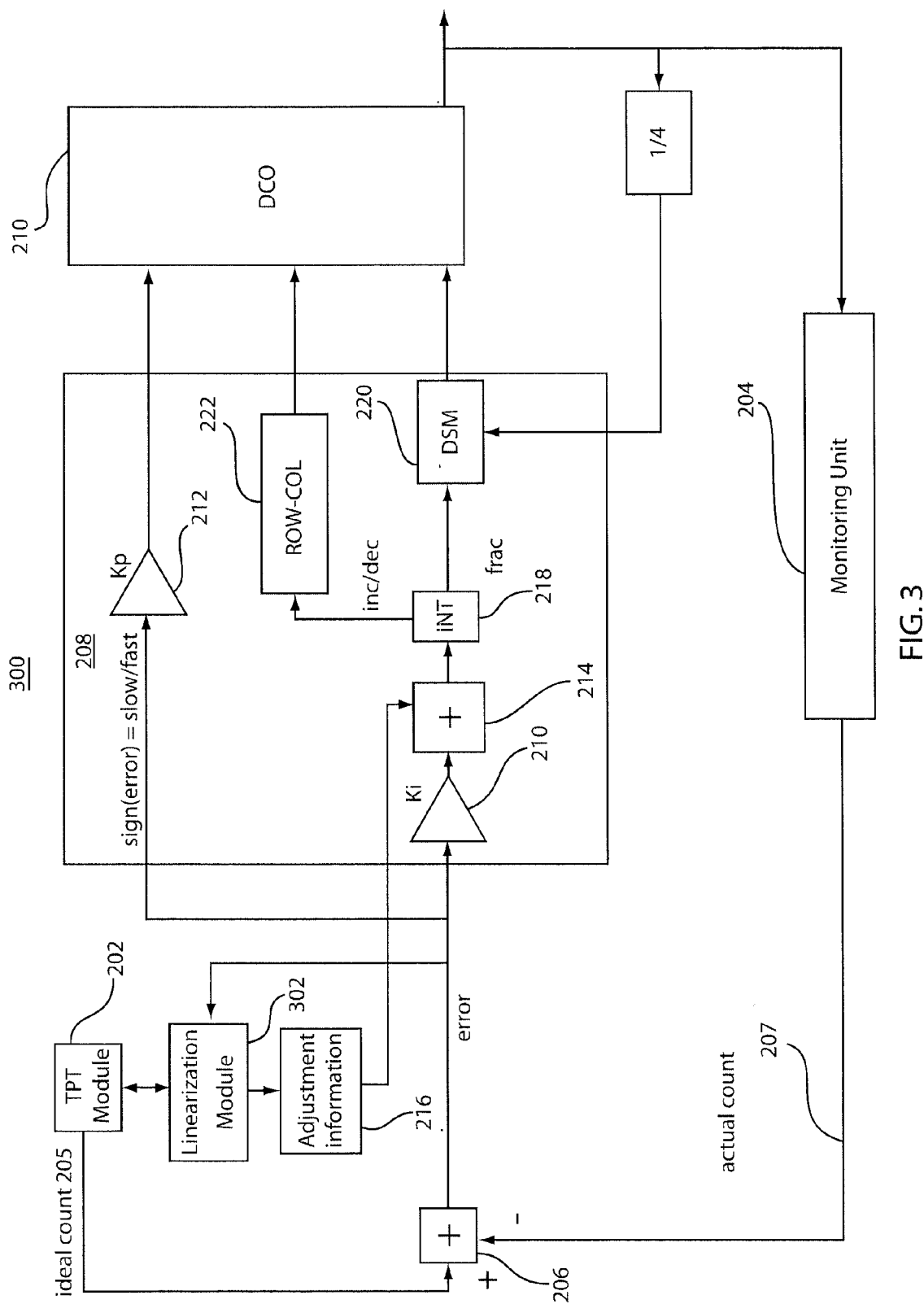
FIG. 3 is a block/flow diagram of an alternative phase profile generator system, device and apparatus embodiment.

Referring now to FIG. 3 with continuing reference to FIG. 2, an exemplary phase profile generator system 300 that adapts adjustment information based on prior DCO controls is illustrated. It should be noted that the elements of system 300 that are included in system 200 function in the same manner as in the system 200, except for differences indicated here. In the system 300, the error output signal from the digital phase error detector 206 is fed into a linearization module 302, which can be under the control of the TPT module 202 and can accumulate and store the history of the error signals. Using the history of the error signals, the linearization module 302 can separate systematic effects from noise after several runs. The detected systematic errors can result from non-linearities in elements of the system, such as the DCO 210. Further, the linearization module 302 can use the detected systematic errors as corrections to the adjustment information 216, which can be a ramp slope. Here, the corrections to the adjustment information 216 can be applied on a cycle by cycle basis, since DCO and other non-linearities depend on the frequency. In certain exemplary embodiments, the linearization module 302, and also the TPT module 202, can be implemented as a program of instructions that are performed by a processor.

It should be noted that there are several benefits of configuring the control loop to be adaptive. For example, in a periodic setting, such as sawtooth ramp generation, for example, the linearization module 302 can store the values of the control signals that had been applied at various points during the previous ramp and can pre-apply corrections in the current ramp prior to receiving the current error feedback signal. This would in effect result in adaptively driving the plant to the desired ideal transfer function. In the ramp generation example, the adaptive drive would aid in linearizing the DCO. If storing the controls is too costly, the control loop can have a model of the plant (the DCO, for example) and can update the parameters of the model based on previous ramps. In this case, the control signals will be dynamically calculated based on the model and on the updated values of the parameters from the previous frequency ramps (or previous frequency jumps, or combinations of previous frequency ramps and frequency jumps, depending on the particular implementation of the target phase trajectory).

Figure 4:
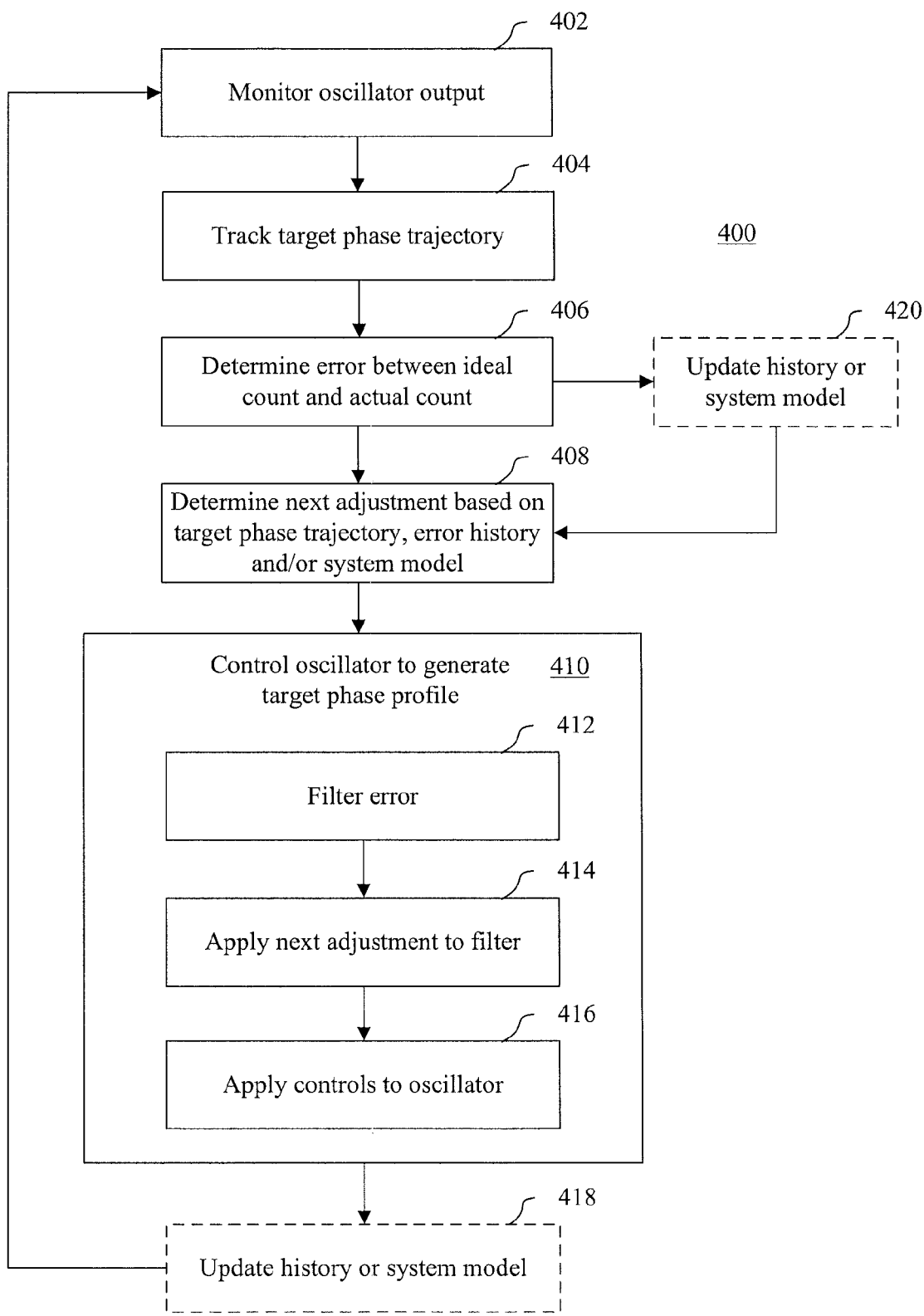
FIG. 4 is a block/flow diagram of an embodiment of a method for generating a phase profile.

Referring now to FIG. 4 with continuing reference to FIGS. 2 and 3, an exemplary method 400 for generating a phase profile is illustrated. It should be noted that each of the features of the elements of systems 200 and 300 described above can be applied in the method 400. The method 400 can begin at step 402, in which the monitoring unit 204 can monitor the state of the output signal of the DCO 210. Further, as stated above, the monitoring unit 204 can be a counter and need not be reset to a fixed state after every reference clock cycle. Thus, to implement step 402, the monitoring unit 204 can run for a plurality of reference clock cycles without a reset to increase its effective resolution. Moreover, as indicated above, the unit 204 can interpolate measurements of the DCO output signal. For example, the unit 204 can interpolate between count values of the output signal based on DCO control inputs to provide a sub-unit cycle resolution.

At step 404, the TPT module 202 can track the target phase trajectory to enable the TPT module to determine an adjustment 216 of the output signal. For example, as noted above, the TPT module 202 can generate the target phase trajectory and/or can retrieve the trajectory from a storage medium. In addition, the target phase trajectory can be or include a frequency jump trajectory and/or a frequency ramp trajectory. Furthermore, as stated above, the target phase trajectory can be independent of the precision of the monitoring unit 204 to reduce the quantization noise in the system.

At step 406, the error detector 206 can compute the error between the ideal count of the target phase trajectory and the actual count of the output signal of the oscillator 210 provided by the monitoring unit 204.

At step 408, the TPT module 202 can determine a next adjustment 216 of the oscillator output signal based on the target phase trajectory. Here, the TPT module 202 can configure the next adjustment 216 to conform the output signal to a portion of the target phase trajectory. For example, as noted above, the systems 200 and 300 can employ the target phase trajectory as a model for the desired phase profile of the output signal of the oscillator 210. Thus, over time, the TPT module 202 may track the trajectory, portion by portion, and may compute an adjustment 216 for each of the tracked portions of the trajectory. For example, the trajectory may include a frequency ramp and the TPT module 202 may segment the trajectory and compute a ramp slope for each of the segments as the adjustment information 216. Each portion or segment may correspond to one correction or adjustment cycle of the control loop so that the tracking of a new portion is initiated upon input of the adjustment information into the control loop filter. As noted above, the TPT module 202 can determine the adjustment independently of the monitored current state of the DCO. Accordingly, the adjustment can be an open loop adjustment.

Returning to step 406, it should be noted that the error detector 206 can determine an error between the output signal and a current target phase trajectory value that precedes the portion of the target phase trajectory corresponding to the "next adjustment" determined at step 408. For example, the target phase trajectory value is "current" in the sense that it is the value of the trajectory that the system expects the currently measured output signal of the oscillator 210 to match. This value is within a portion of the trajectory that precedes the portion of the target phase trajectory for which the "next" adjustment is determined at step 408. In other words, the value is within a portion of the trajectory corresponding to an adjustment 216 determined during a preceding iteration of the control loop. It should also be noted that the error determination is independent of the next adjustment determined at step 408. For example, as noted above, this feature is a substantial improvement over the known system 100 of FIG. 1, as it significantly reduces the phase error and the bandwidth of the control loop, resulting in the reduction of phase noise. In addition, this feature also enables the detector 206 to only compare the difference between the ideal trajectory and the actual output of the oscillator.

At step 410, the control loop can control the oscillator 210 to generate the desired phase profile in accordance with both the adjustment determined at step 408 and the error determined at step 406. To implement step 410, the control loop can perform steps 412-416.

At step 412, the control loop can filter the error between the output signal and the phase trajectory, as illustrated in FIGS. 2 and 3. For example, the loop filter can include a proportional path 212 and an integral path 210. As stated above, the proportional path 212 can be directly connected to the oscillator 210 to reduce latency in the loop and thereby further reduce noise. Here, the error detector 206 can apply the sign of the error to the proportional path and can provide the error to the integral path for multiplication by $k_i$. As indicated in FIGS. 2 and 3, the loop filter 208 can be configured to receive the error separately from the adjustment 216.

At step 414, the TPT module 202 can apply the adjustment 216 determined at step 408 directly to the loop filter 208. In particular, the TPT module 202 can apply the adjustment 216 directly to the integral path of the loop filter. It should be noted that although an adjustment 216 can be determined for each cycle of the control loop, the system can be configured such that the TPT module 202 applies the adjustment 216 only when the adjustment 216 is different from an adjustment determined or applied in a preceding iteration of the control loop.

At step 416, the control loop can control the oscillator 210 in accordance with the adjustment 216 and the error output of the detector 206 to generate the desired phase profile, as described above with respect to systems 200 and 300. For example, the adder 214 can sum the $k_i$ multiplied error in the integral path with the adjustment 216 and can provide the result to the integrator 218. In turn, the controller 222 and the DSM 220 can provide control signals to the oscillator 210 based on the output of the integrator, as described above. In addition, the output of the proportional path can be applied to the oscillator 210 to aid in conforming the output signal of the oscillator 210 to the phase trajectory, as described above. Thereafter, the method 400 may proceed to step 402 and may repeat to implement the next cycle of the control loop.

Optionally, the method 400 may include an update of the control history or a system model at step 418 based upon the controls applied to the oscillator 210. For example, as noted above, the linearization module 302 can monitor state variables of the system and can store a history of errors between the output signal and the target phase trajectory. As stated above, the linearization module 302 can also store a model of the oscillator and can update the model based upon the error between the output signal and the target phase trajectory. Thereafter, the method 400 may proceed to step 402 and may repeat to implement the next cycle of the control loop. Thus, at each iteration of the method 400, the linearization module 302 can record and update the determined error and/or can update the system model based on the determined error. It should be noted that although the linearization module 302 was described above as a independent unit in the system 300, the linearization module 302 can be implemented as a component of the TPT module 202.

Further, the TPT 202 module can employ the history and/or the system model to modify the adjustment 216 at step 408. For example, as indicated above, the TPT module 202 can adaptively modify the adjustment 216 in accordance with state variables of the system to linearize the output signal of the oscillator 210. In particular, the modification of the adjustment 216 by the TPT module 202 can be based on the control history and/or the system model, which in turn are based on at least one previous error between the output signal and target phase trajectory. In addition, TPT module 202 can apply the modified adjustment 216 to the control loop at step 414 as described above.

It should be noted that although the adjustment 216 can adaptively depend on the error history of the system, the TPT module 202 can nonetheless determine and apply the adjustment at steps 408 and 414, respectively, independently of a monitored current state of the oscillator. As indicated above, in any given iteration, the TPT module 202 can pre-apply the current adjustment prior to receiving the current error feedback signal in the same control loop iteration to aid in linearizing the oscillator. Thus, although the adjustment 216 can be dependent on previous errors, the TPT module 202 can apply the adjustment 216 to the control loop at step 414 prior to receipt of the current error signal from the detector 206. As such, the determination and application of the adjustment at steps 408 and 414 can be independent of a monitored current state of the oscillator.

Alternatively, the system 100 can be configured such that the current error feedback signal is employed by the TPT module 202 to generate the adjustment at step 408. For example, at step 420, the linearization module 302 can update the history and/or the system model with the current error signal in response to the performance of step 406 at which the current error is determined. Thereafter, the TPT module 202 can implement the determination of the next adjustment at step 408 based on the updated history and/or system model. As such, the adjustment 216 can be dependent on both previous errors and a current error determined by the detector 206.

Having described preferred embodiments of adaptive phase profile generator systems and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A phase profile generator system, comprising:
    a signal generator configured to generate an output signal;
    a target phase trajectory module configured to track a target phase trajectory and determine a next adjustment of the output signal based on a portion of the target phase trajectory to conform the output signal to the portion of the target phase trajectory;
    an error detector configured to determine an error between the output signal and a current target phase trajectory value that precedes the portion of the target phase trajectory, wherein the determination of the error is independent of the next adjustment of the output signal; and
    a control loop filter configured to control the signal generator in accordance with both the next adjustment and the error simultaneously to generate a phase profile.

2. The system of claim 1, wherein the target phase trajectory includes at least one of a frequency jump trajectory or a frequency ramp trajectory.

3. The system of claim 2, wherein the next adjustment is a ramp slope.

4. The system of claim 1, wherein the control loop filter further comprises an integral path and a proportional path.

5. The system of claim 4, where the proportional path is directly connected to the signal generator.

6. The system of claim 4, wherein the next adjustment is applied to the integral path.

7. The system claim 1, wherein the next adjustment is an open loop adjustment.

8. A phase profile generator device, comprising:
a signal generator configured to generate an output signal;
a monitoring unit configured to monitor a current state of the output signal;
a target phase trajectory module configured to track a target phase trajectory and determine an adjustment of the output signal independently of the monitored current state to conform the output signal to the target phase trajectory; and
a control loop filter that is configured to directly receive the adjustment to control the signal generator in accordance with the adjustment and generate a phase profile.

9. The device of claim 8, wherein the precision of the target phase trajectory is independent of the precision of the monitoring unit.

10. The device of claim 8, wherein the target phase trajectory module is further configured to adaptively modify the adjustment.

11. The device of claim 10, wherein the target phase trajectory module is further configured to modify the adjustment in accordance with state variables of the device.

12. The device of claim 8, wherein the monitoring unit is further configured to run without a reset for a plurality of reference clock cycles.

13. The device of claim 12, wherein the monitoring unit is further configured to interpolate measurements of the output signal.

14. A phase profile generator apparatus comprising:
a signal generator configured to generate an output signal;
a target phase trajectory module configured to track a target phase trajectory and determine a next adjustment of the output signal to conform the output signal to the target phase trajectory, wherein the target phase trajectory module further includes a linearization module configured to implement a modification of the next adjustment to linearize the output signal;
an error detector configured to determine an error between the output signal and the target phase trajectory; and
a control loop filter that is configured to receive the error separately from the next adjustment and is configured to control the signal generator in accordance with both the next adjustment and the error to generate a phase profile.

15. The apparatus of claim 14, wherein the linearization module is configured to monitor state variables of the apparatus.

16. The apparatus of claim 15, wherein the target phase trajectory module is further configured to apply the modified next adjustment to the control loop filter prior to receipt of the error.

17. The apparatus of claim 15, wherein the linearization module is further configured to store a history of errors between the output signal and the target phase trajectory and to implement the modification based upon said history.

18. The apparatus of claim 15, wherein the linearization module is further configured to store a model of the signal generator and to update the model based upon the error between the output signal and the target phase trajectory to implement the modification of the next adjustment.

19. A method for generating a phase profile comprising:
tracking a target phase trajectory to determine a next adjustment of an output signal of a signal generator based on a portion of the target phase trajectory to conform the output signal to the portion of the target phase trajectory;
determining an error between the output signal and a current target phase trajectory value that precedes the portion of the target phase trajectory, wherein the determination of the error is independent of the next adjustment of the output signal; and
controlling the signal generator in accordance with both the next adjustment and the error simultaneously to generate the phase profile.

20. The method of claim 19, further comprising:
monitoring a current state of the output signal, wherein the determination of the next adjustment is independent from the monitored current state.

21. The method of claim 19, wherein the controlling further comprises directly applying the next adjustment to a loop filter.

22. The method of claim 19, wherein the controlling further comprises applying the error to a loop filter separately from the next adjustment.

23. The method of claim 22, wherein the controlling further comprises applying the next adjustment directly to an integral path of the loop filter.

24. The method of claim 19, wherein the target phase trajectory includes at least one of a frequency jump trajectory or a frequency ramp trajectory.

25. The method of claim 19, wherein the next adjustment is determined by modifying the next adjustment based upon at least one previous error between the output signal and target phase trajectory values to linearize the output signal.

* * * * *